United States Patent
Asadi et al.

(10) Patent No.: US 11,430,499 B2
(45) Date of Patent: Aug. 30, 2022

(54) REDUCING READ DISTURBANCE ERROR IN TAG ARRAY

(71) Applicants: Hossein Asadi, Tehran (IR); Elham Cheshmikhanikhanghah, Tehran (IR)

(72) Inventors: Hossein Asadi, Tehran (IR); Elham Cheshmikhanikhanghah, Tehran (IR)

( * ) Notice: Subject to any disclaimer, the term of this patent is extended or adjusted under 35 U.S.C. 154(b) by 0 days.

(21) Appl. No.: 17/204,957

(22) Filed: Mar. 18, 2021

(65) Prior Publication Data
US 2021/0201974 A1 Jul. 1, 2021

Related U.S. Application Data

(60) Provisional application No. 62/991,081, filed on Mar. 18, 2020.

(51) Int. Cl.
*G11C 11/00* (2006.01)
*G11C 11/16* (2006.01)
*H03K 19/20* (2006.01)

(52) U.S. Cl.
CPC ...... *G11C 11/1673* (2013.01); *G11C 11/1659* (2013.01); *H03K 19/20* (2013.01)

(58) Field of Classification Search
CPC .. G11C 11/1673; G11C 11/1659; H03K 19/20
USPC .......................................................... 365/158
See application file for complete search history.

(56) References Cited

U.S. PATENT DOCUMENTS

2018/0365154 A1* 12/2018 Ranjan ................ G11C 11/1675
2020/0192752 A1* 6/2020 Asadi ................... G06F 11/1641

* cited by examiner

*Primary Examiner* — Huan Hoang
(74) *Attorney, Agent, or Firm* — Bajwa IP Law Firm; Haris Zaheer Bajwa

(57) ABSTRACT

A circuit for reducing read disturbance error in a tag array. The circuit includes a decoder, a plurality of m-bit comparators, and a plurality of n-bit comparators. The decoder is configured to enable access to a respective set of the tag array based on a value of an index of a requested address. Each respective m-bit comparator is configured to enable access to a respective plurality of Most Significant Bits (MSBs) of the respective set responsive to each respective Least Significant Bit (LSB) of a respective plurality of LSBs of the respective set being equal to a respective LSB of a tag of the requested address. Each respective n-bit comparator is configured to enable access to the respective set by a data bus responsive to each respective MSB of the respective plurality of MSBs being equal to a respective MSB of the tag.

20 Claims, 10 Drawing Sheets

REDUCING READ DISTURBANCE ERROR IN TAG ARRAY

CROSS-REFERENCE TO RELATED APPLICATION

This application claims the benefit of priority from pending U.S. Provisional Patent Application Ser. No. 62/991,081, filed on Mar. 18, 2020, and entitled "A ROBUST MRAM-BASED CACHE AGAINST READ DISTURBANCE ERROR IN TAG ARRAY," which is incorporated herein by reference in its entirety.

TECHNICAL FIELD

The present disclosure generally relates to storage systems, and particularly, to emerging technologies and cache memories.

BACKGROUND

Static random access memories (SRAMs) have been a prevalent memory technology in on-chip caches. SRAMs, however, face several challenges, e.g., a high leakage power and cell instability, by technology downscaling. Recent developments in non-volatile memory (NVM) technology have made spin-transfer torque magnetic RAMs (STT-MRAMs) an alternative for SRAMs in on-chip caches. A near-zero leakage power, immunity to radiation-induced errors, higher density, better scalability, and non-volatility are some advantages of STT-MRAM caches. However, STT-MRAM caches may be error-prone in read operations. When a read current is applied to cache cells during a read operation, it is probable that contents of the cells flip unintentionally. This error, known as read disturbance, originates from a stochastic switching behavior of STT-MRAM cells.

Error detecting and correcting codes may be employed to protect on-chip caches against read disturbance error. Overwriting STT-MRAM cells after each read operation may be another approach to tackle with read disturbance errors. Reducing the read current and designing more accurate sensing circuits to moderate its adverse effects on false read errors may be an approach to decrease the read disturbance rate in STT-MRAM cells. However, these approaches have addressed read disturbance in data part of cache memories and may have limited capability for read disturbance reduction of tag due to a number of reasons. First, read current reduction may be limited to a value at which memory cells are still readable beside its adverse effect on read latency. In addition, overwriting tag ways in each cache access may extremely increase energy consumption and may impose significant performance penalties due to high write latency of STT-MRAM cells in read-restore scheme. Furthermore, frequent data patterns required for data compression schemes may be found with less frequency in tag arrays containing requested addresses. Moreover, ECCs may be limited to correcting single errors because of high energy, area, and performance cost of providing larger correction capabilities in tag parts of a cache memories.

There is, therefore, a need for a scheme for reducing disturbance error in tag arrays of cache memories. There is further a need for an architecture for tag arrays that may be robust against read disturbance.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary circuit for reducing read disturbance error in a cache memory. An exemplary cache memory may include a tag array. An exemplary tag array may include a plurality of tag ways. An exemplary $k^{th}$ tag way of the plurality of tag ways may include a $k^{th}$ plurality of sets where $0 \le k \le K-1$ and K is a number of the plurality of tag ways. Each respective exemplary set of the $k^{th}$ plurality of sets may include a respective plurality of Least Significant bits (LSBs) and a respective plurality of Most Significant Bits (MSBs). An exemplary circuit may include a decoder, a plurality of m-bit comparators where m is a number of each respective plurality of LSBs, and a plurality of n-bit comparators where n is a number of each respective plurality of MSBs.

In an exemplary embodiment, the decoder may be coupled to the plurality of tag ways. An exemplary decoder may be configured to enable access to an $(i, k)^{th}$ set of the $k^{th}$ plurality of sets based on a value of an index of a requested address in the cache memory, where $0 \le i \le h-1$ and h is a number of the $k^{th}$ plurality of sets. An exemplary $k^{th}$ m-bit comparator of the plurality of m-bit comparators may be configured to access an $(i, k)^{th}$ plurality of LSBs of the $(i, k)^{th}$ set responsive to the access to the $(i, k)^{th}$ set being enabled by the decoder, compare the $(i, k)^{th}$ plurality of LSBs with m lower bits of a tag of the requested address, and enable access to an $(i, k)^{th}$ plurality of MSBs of the $(i, k)^{th}$ set responsive to each respective LSB of the $(i, k)^{th}$ plurality of LSBs being equal to a respective lower bit of the tag. An exemplary $k^{th}$ n-bit comparator of the plurality of n-bit comparators may be configured to access the $(i, k)^{th}$ plurality of MSBs responsive to the access to the $(i, k)^{th}$ plurality of MSBs being enabled by the $k^{th}$ m-bit comparator, compare the $(i, k)^{th}$ plurality of MSBs with n higher bits of the tag, and enable access to the $(i, k)^{th}$ set by a data bus responsive to each respective MSB of the $(i, k)^{th}$ plurality of MSBs being equal to a respective higher bit of the tag.

An exemplary circuit may further include a plurality of latch circuits. In an exemplary embodiment, a $k^{th}$ latch circuit of the plurality of latch circuits may be configured to enable access of the decoder to the $(i, k)^{th}$ plurality of LSBs responsive to receiving a request signal associated with a read operation from the cache memory and disable access of the decoder to the $(i, k)^{th}$ plurality of LSBs responsive the decoder accessing the $(i, k)^{th}$ plurality of LSBs.

An exemplary circuit may further include a plurality of LSB transition gates. An exemplary $(i, k)^{th}$ LSB transition gate of the plurality of LSB transition gates may be configured to enable access of the decoder to the $(i, k)^{th}$ plurality of LSBs responsive to the $(i, k)^{th}$ LSB transition gate being activated by the $k^{th}$ latch circuit An exemplary circuit may further include a plurality of MSB transition gates. An exemplary $(i, k)^{th}$ MSB transition gate of the plurality of MSB transition gates may be configured to enable access of the decoder to the $(i, k)^{th}$ plurality of MSBs responsive to the $(i, k)^{th}$ MSB transition gate being activated by the $k^{th}$ m-bit comparator In an exemplary embodiment, the decoder may include a plurality of decoder outputs. An exemplary $i^{th}$ decoder output of the plurality of decoder outputs may be connected to each of the $(i, k)^{th}$ LSB transition gate and the $(i, k)^{th}$ MSB transition gate. In an exemplary embodiment, the $i^{th}$ decoder output may be configured to load data stored in each respective lower memory cell of an $(i, k)^{th}$ plurality of lower memory cells in the cache memory to a respective lower bit line of a plurality of lower bit lines in the cache memory by loading a word line signal to a respective access transistor of each respective lower memory cell responsive to the $(i, k)^{th}$ LSB transition gate being activated by the $k^{th}$ latch circuit. In an exemplary embodiment, each respective lower bit line of the plurality of lower bit lines may be associated with a respective LSB of a respective plurality of LSBs. An exemplary $i^{th}$ decoder output may be further configured to load data stored in each respective higher memory cell of an $(i, k)^{th}$ plurality of higher memory cells in the cache memory to a respective higher bit line of a plurality of higher bit lines in the cache memory by loading the word line signal to a respective access transistor of each respective higher memory cell responsive to the $(i, k)^{th}$ MSB transition gate being activated by the $k^{th}$ m-bit comparator. In an exemplary embodiment, each respective higher bit line of the plurality of higher bit lines associated with a respective MSB of a respective plurality of MSBs.

In an exemplary embodiment, the $k^{th}$ latch circuit may include a set input and a latch output. An exemplary set input may be configured to activate the $k^{th}$ latch circuit responsive to receiving the request signal at the set input. An exemplary latch output may be connected to a control input of the $(i, k)^{th}$ LSB transition gate. In an exemplary embodiment, the latch output may be configured to enable the access of the decoder to each of the $(i, k)^{th}$ plurality of LSBs by activating the $(i, k)^{th}$ LSB transition gate via the control input responsive to the $k^{th}$ latch circuit being activated.

In an exemplary embodiment, the $k^{th}$ latch circuit may further include a reset input and an inverted latch output. An exemplary reset input may be coupled to each of the plurality of lower bit lines. In an exemplary embodiment, the reset input may be configured to deactivate the $k^{th}$ latch circuit responsive to receiving data loaded from one or more of the plurality of lower memory cells on one or more of the plurality of lower bit lines at the reset input. An exemplary inverted latch output may be connected to an inverted control input of the $(i, k)^{th}$ LSB transition gate In an exemplary embodiment, the inverted latch output may be configured to disable the access of the decoder to the $(i, k)^{th}$ plurality of LSBs by deactivating the $(i, k)^{th}$ LSB transition gate via the inverted control input responsive to the $k^{th}$ latch circuit being deactivated by the reset input.

In an exemplary embodiment, the $k^{th}$ m-bit comparator may include a first plurality of comparator inputs, a second plurality of comparator inputs, a comparator output, and an inverted comparator output. An exemplary first plurality of comparator inputs may be connected to the m lower bits of the tag. An exemplary second plurality of comparator inputs may be coupled to the plurality of lower bit lines. In an exemplary embodiment, the comparator output may be connected to the control input of the $(i, k)^{th}$ MSB transition gate. An exemplary comparator output may be configured to enable the access of the decoder to each of the $(i, k)^{th}$ h plurality of MSBs by activating the $(i, k)^{th}$ MSB transition gate via the control input responsive to each respective first comparator input of the first plurality of comparator inputs being equal to a respective second comparator input of the second plurality of comparator inputs. An exemplary inverted comparator output may be connected to an inverted control input of the $(i, k)^{th}$ MSB transition gate. In an exemplary embodiment, the inverted comparator output may be configured to disable the access of the decoder to the $(i, k)^{th}$ plurality of MSBs by deactivating the $(i, k)^{th}$ MSB transition gate via the inverted control input responsive to at least one respective first comparator input of the first plurality of comparator inputs being different from a respective second comparator input of the second plurality of comparator inputs.

An exemplary circuit may further include an m-bit sense amplifier. An exemplary m-bit sense amplifier may be coupled to the plurality of lower bit lines. In an exemplary embodiment, the m-bit sense amplifier may be configured to amplify signals on each of the plurality of lower bit lines.

An exemplary circuit may further include an inverter and an AND gate. In an exemplary embodiment, the inverter may be coupled to the plurality of lower bit lines. An exemplary AND gate may include a first AND input, a second AND input, and an AND output. An exemplary first AND input may be configured to receive the request signal. An exemplary second AND input may be connected to the inverter. In an exemplary embodiment, the second AND input may be configured to be deactivated by the inverter responsive to receiving data from at least one of the plurality of lower bit lines by the inverter. An exemplary AND output may be connected to the set input. In an exemplary embodiment, the AND output may be configured to activate the $k^{th}$ latch circuit by activating the set input responsive to receiving the request signal by the first AND input. In an exemplary embodiment, the AND output may be further configured to deactivate the set input responsive to deactivating the second AND input by the inverter.

An exemplary circuit may further include a plurality of buffer circuits. An exemplary $k^{th}$ buffer circuit of the plurality of buffer circuits may be configured to load data stored in the $(i, k)^{th}$ set on the data bus responsive to each respective MSB of the $(i, k)^{th}$ plurality of MSBs being equal to a respective higher bit of the tag. In an exemplary embodiment, the $k^{th}$ buffer circuit may include a buffer control input. An exemplary buffer control input may be coupled to the $k^{th}$ n-bit comparator. In an exemplary embodiment, the buffer control input may be configured to activate the $k^{th}$ buffer circuit responsive to being activated by the $k^{th}$ n-bit comparator.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by tag way of example only, not by tag way of limitation. In the figures, like reference numerals refer to the same or similar elements.

DETAILED DESCRIPTION

In the following detailed description, numerous specific details are set forth by tag way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein is disclosed an exemplary circuit for reducing read disturbance in a tag array of a cache memory. An exemplary circuit architecture may decrease number of reads from tag cells in each access by eliminating a large fraction of unnecessary reads. To this end, a requested tag address may be compared with contents of tag ways in two steps. In a first step, a few lower order bits of all tag ways may be read and compared with a corresponding part of a requested address using a first group of comparators. In the next step, mismatched tag ways may be disabled and a remaining bits of other tag ways may be read and compared with corresponding bits of the requested address using a second group of comparators. Since the bitwise similarity of tags in a set is likely to be reduced in lower order bits, a majority of tag ways may be discarded from the second step. By eliminating a large fraction of read operations in an exemplary tag array, read disturbance rate may be significantly reduced.

Figure 1:
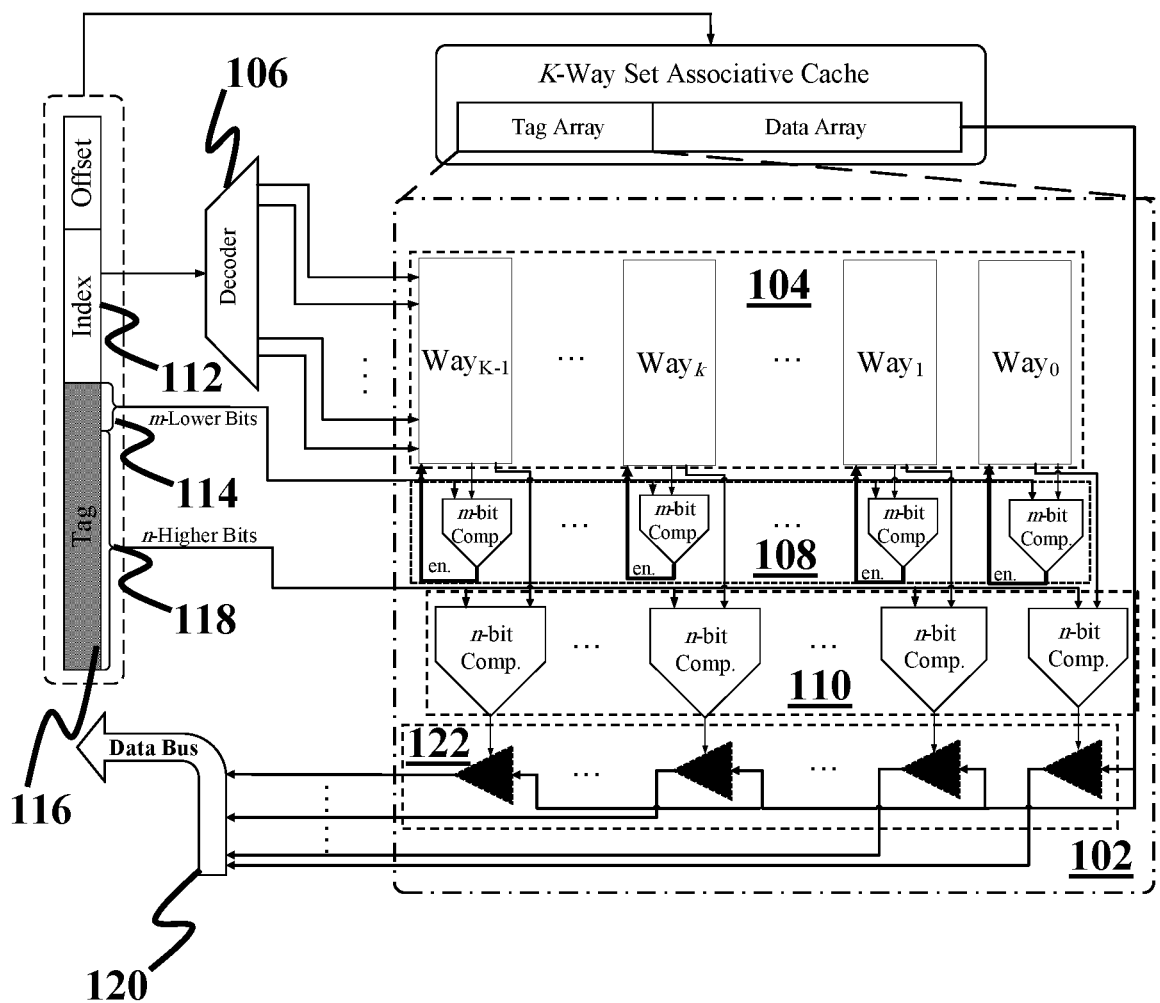
FIG. 1 shows a schematic of a circuit for reducing read disturbance error in a tag array of a cache memory, consistent with one or more exemplary embodiments of the present disclosure.

FIG. 1 shows a schematic of a circuit for reducing read disturbance error in a tag way of a cache memory, consistent with one or more exemplary embodiments of the present disclosure. An exemplary cache memory 100 may include a tag array 102. An exemplary tag array 102 may include a plurality of tag ways 104. Each exemplary tag way of plurality of tag ways 104 may provide a physical path to a corresponding data line in tag array 102 to perform a read or write data operation on that data line. An exemplary circuit comprising cache memory 100 may include a decoder 106, a plurality of m-bit comparators 108, and a plurality of n-bit comparators 110. In an exemplary embodiment, contents of each tag way of plurality of tag ways 104 may be stored in a number of memory cells. Each exemplary memory cell may store one bit of data. In an exemplary embodiment, data bits of each tag way that are stored in the memory cells may be split into a lower order part (including m least significant bits of the tag way) and a higher order part (including n most significant bits of the tag way, where n=N−m and N is a total number of bits in the tag way). In an exemplary embodiment, after decoding an index part 112 of a requested address in cache memory 100 by decoder 106, the lower order part of each tag way may be compared with a corresponding lower order part of index 112 by each respective m-bit comparator of plurality of m-bit comparators 108. In an exemplary embodiment, each tag way that may be similar to index 112 in the lower order part may be further accessed by a respective n-bit comparator of plurality of n-bit comparators 110 to compare the tag way's higher order part with a corresponding higher order part of index 112. On the other hand, in an exemplary embodiment, no further access may be allowed to tag ways that are different from index 112 in the lower order part. Therefore, in an exemplary embodiment, respective n-bit comparators may be disabled to save power consumption. In an exemplary embodiment, a target data block may be determined by a corresponding n-bit comparator that may detect a tag way that may be similar to index 112 in higher order part. In an exemplary embodiment, the two step comparison may reduce unnecessary access to memory cells of tag ways, which may lead to a read disturbance reduction in tag array 102.

Figure 2:
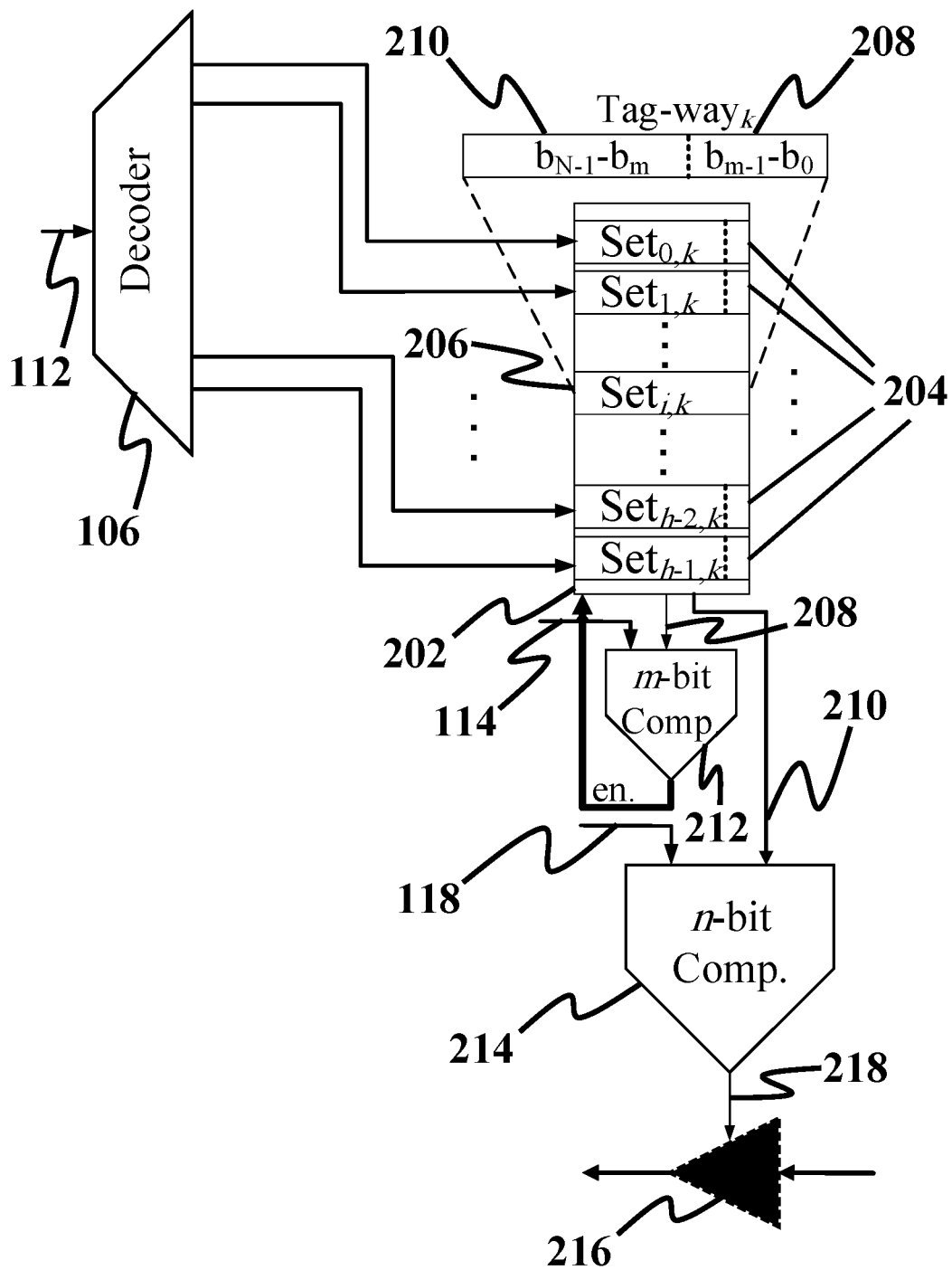
FIG. 2 shows a schematic of a tag way coupled to respective elements of a tag array, consistent with one or more exemplary embodiments of the present disclosure.

For further detail regarding tag array 102, FIG. 2 shows a schematic of a tag way coupled to respective elements of a tag array, consistent with one or more exemplary embodiments of the present disclosure. Referring to FIGS. 1 and 2, an exemplary $k^{th}$ tag way 202 of plurality of tag ways 104 may include a $k^{th}$ plurality of sets 204 where 0≤k≤K−1 and K is a number of plurality of tag ways 104. Each respective exemplary set of $k^{th}$ plurality of sets 204 may include a respective plurality of Least Significant Bits (LSBs) and a respective plurality of Most Significant Bits (MSBs). For example, an $(i, k)^{th}$ set 206 of $k^{th}$ plurality of sets 204 may include an $(i, k)^{th}$ plurality of LSBs 208 and an $(i, k)^{th}$ plurality of MSBs 210, where 0≤i≤h−1 and h is a number of sets in $k^{th}$ plurality of sets 204. In an exemplary embodiment, a number of each respective plurality of LSBs may be equal to m and a number of each respective plurality of MSBs may be equal to n.

In an exemplary embodiment, decoder 106 may be coupled to plurality of tag ways 104. In an exemplary embodiment, decoder 106 may be configured to enable access to $(i, k)^{th}$ set 206 based on a value of index 112 of a requested address in cache memory 100. In an exemplary embodiment, index 112 may be decoded by decoder 106 to a value that may correspond to only one set in each respective plurality of sets. Based on an exemplary decoded value, decoder 106 may be coupled to a respective set to enable access to the set.

An exemplary $k^{th}$ m-bit comparator 212 of plurality of m-bit comparators 108 may be configured to access (i, k)$^{th}$ plurality of LSBs 208 responsive to the access to (i, k)$^{th}$ set 206 being enabled by decoder 106. Therefore, in an exemplary embodiment, if index 112 is decoded to a value that corresponds to (i, k)$^{th}$ set 206, decoder 106 may be coupled to (i, k)$^{th}$ set 206 and access to (i, k)$^{th}$ set 206 may be enabled. In an exemplary embodiment, $k^{th}$ m-bit comparator 212 may be further configured to compare (i, k)$^{th}$ plurality of LSBs 208 with m lower bits 114 of a tag 116 of the requested address and enable access to (i, k)$^{th}$ plurality of MSBs 210 responsive to each respective LSB of (i, k)$^{th}$ plurality of LSBs 208 being equal to a respective lower bit of tag 116. Therefore, in an exemplary embodiment, if each respective LSB of (i, k)$^{th}$ plurality of LSBs 208 is determined to be equal to a respective lower bit of m lower bits 114, access to (i, k)$^{th}$ plurality of MSBs 210 may be enabled by $k^{th}$ m-bit comparator 212. As a result, in an exemplary embodiment, access to an MSB part of each set may depend on its LSB part. If, in an exemplary embodiment, the LSB part is equal to the corresponding lower bits of the address tag, the MSB part of the set may be accessed in a next step. Otherwise, in an exemplary embodiment, no further access may be allowed to the set.

An exemplary $k^{th}$ n-bit comparator 214 of plurality of n-bit comparators 110 may be configured to access (i, k)$^{th}$ plurality of MSBs 210 responsive to access to (i, k)$^{th}$ plurality of MSBs 210 being enabled by $k^{th}$ m-bit comparator 212. Therefore, in an exemplary embodiment, if each respective LSB of (i, k)$^{th}$ plurality of LSBs 208 is determined to be equal to a respective lower bit of m lower bits 114 by $k^{th}$ m-bit comparator 212, (i, k)$^{th}$ plurality of MSBs 210 may be loaded to $k^{th}$ n-bit comparator 214. In an exemplary embodiment, $k^{th}$ n-bit comparator 214 may be further configured to compare (i, k)$^{th}$ plurality of MSBs 210 with n higher bits 118 of tag 116 and enable access to (i, k)$^{th}$ set 206 by a data bus 120 responsive to each respective MSB of (i, k)$^{th}$ plurality of MSBs 210 being equal to a respective higher bit of tag 116. As a result, in an exemplary embodiment, if each respective MSB of (i, k)$^{th}$ plurality of MSBs 210 is determined to be equal to a respective higher bit of n higher bits 118, data stored in (i, k)$^{th}$ set 206 may be loaded to data bus 120. Therefore, in an exemplary embodiment, plurality of n-bit comparators 110 may determine a target data block in cache memory 100 after accessing each respective plurality MSBs by a respective n-bit comparator based on a respective result of comparison with n higher bits 118.

An exemplary circuit may further include a plurality of buffer circuits 122. An exemplary $k^{th}$ buffer circuit 216 of plurality of buffer circuits 122 may be configured to load data stored in (i, k)$^{th}$ set 206 on data bus 120 responsive to each respective MSB of (i, k)$^{th}$ plurality of MSBs 210 being equal to a respective higher bit of tag 116. As a result, in an exemplary embodiment, if each respective MSB of (i, k)$^{th}$ plurality of MSBs 210 is determined to be equal to a respective higher bit of n higher bits 118, $k^1$ buffer circuit 216 may load data stored in (i, k)$^{th}$ set 206 to data bus 120. In an exemplary embodiment, $k^{th}$ buffer circuit 216 may include a buffer control input 218. In an exemplary embodiment, buffer control input 218 may be coupled to an output node of $k^{th}$ n-bit comparator 214. In an exemplary embodiment, buffer control input 218 may be configured to activate $k^{th}$ buffer circuit 216 responsive to being activated by $k^{th}$ n-bit comparator 214. As a result, in an exemplary embodiment, if each respective MSB of (i, k)$^{th}$ plurality of MSBs 210 is determined by $k^{th}$ n-bit comparator 214 to be equal to a respective higher bit of n higher bits 118, $k^{th}$ n-bit comparator 214 may activate buffer control input 218 (for example, by loading a logic '1' to buffer control input 218). Consequently, in an exemplary embodiment, $k^{th}$ buffer circuit 216 may be activated and may load data stored in (i, k)$^{th}$ set 206 to data bus 120.

In an exemplary embodiment, the number of (i, k)$^{th}$ plurality of LSBs 208, m, may be determined by examining different theoretical observations for different cache sizes. An exemplary tag address length may be decreased by increasing a respective cache size. An exemplary number m may minimize a total number of read bits in both steps of LSB comparisons (by $k^{th}$ m-bit comparator 212) and MSB comparisons (by $k^{th}$ n-bit comparator 214). An exemplary number of total read bits for a $2^K$-way set associative cache may be calculated according to an operation defined by the following:

$$\text{number of read bits} = \qquad\qquad\qquad (1)$$

$$m \times K + (N - m) \times \sum_{j=0}^{K} j \times \binom{K}{j} \times \left(\frac{1}{2^m}\right)^j \times \left(\frac{2^m - 1}{2^m}\right)^{K-j}$$

where N is the number of tag address bits (also referred to as a tag width), m is the number of read bits (i.e., (i, k)$^{th}$ plurality of LSBs 208) in the first step (LSB comparisons), and j is a number of tag matches in the first step, where j may get a value between 0 and K.

In an exemplary embodiment, concavity of (1) may be investigated by calculating a second derivative of (1) according to an operation defined by the following:

$$\frac{\partial^2 \left( m \times K + (N-m) \times \sum_{j=0}^{K} \binom{K}{j} m^2 \times j \times \left(\frac{1}{2^m}\right)^j \times \left(\frac{2^m-1}{2^m}\right)^{K-j} \right)}{\partial m^2} = \qquad (2)$$

$$\frac{K}{2^m} \times \ln 2 \times (2 + (N-m) \times \ln 2)$$

According to (2), in an exemplary embodiment, since the value of m is between 0 and N, the second derivative of (1) is positive definite. Therefore, (1) is concave and has a minimum. In an exemplary embodiment, the minimum of (1) may be obtained by finding a root of a first derivative of (1). In an exemplary embodiment, the first derivative of (1) may be calculated according to an operation defined by the following:

$$\frac{\partial \left( m \times K + (N-m) \times \sum_{j=0}^{K} \binom{K}{j} m^2 \times j \times \left(\frac{1}{2^m}\right)^j \times \left(\frac{2^m-1}{2^m}\right)^{K-j} \right)}{\partial m} = \qquad (3)$$

$$\frac{K}{2^m} \times (\ln 2 \times (N-m) + 2^m - 1)$$

In an exemplary embodiment, number m may be determined by setting (3) to zero to find a root of (3). In an exemplary embodiment, the number of $(i, k)^{th}$ plurality of LSBs 208 may be determined according to an operation defined by the following:

$$m = \frac{1 + N \times \ln 2 - Productlog[2^N e]}{\ln 2} \qquad (4)$$

where N is a sum of the number of $(i, k)^{th}$ plurality of LSBs 208, m, and the number of $(i, k)^{th}$ plurality of MSBs 210, n, e is the Euler's number, and Productlog [·] is a Lambert W function, i.e., Productlog [z] is equal to w if $z=we^w$. As shown in (4), in an exemplary embodiment, the value of m may depend only on N and may be independent from the number of plurality of tag ways 104, K. An exemplary tag width N may be determined based on a cache configuration and a processor address width.

Figure 3:
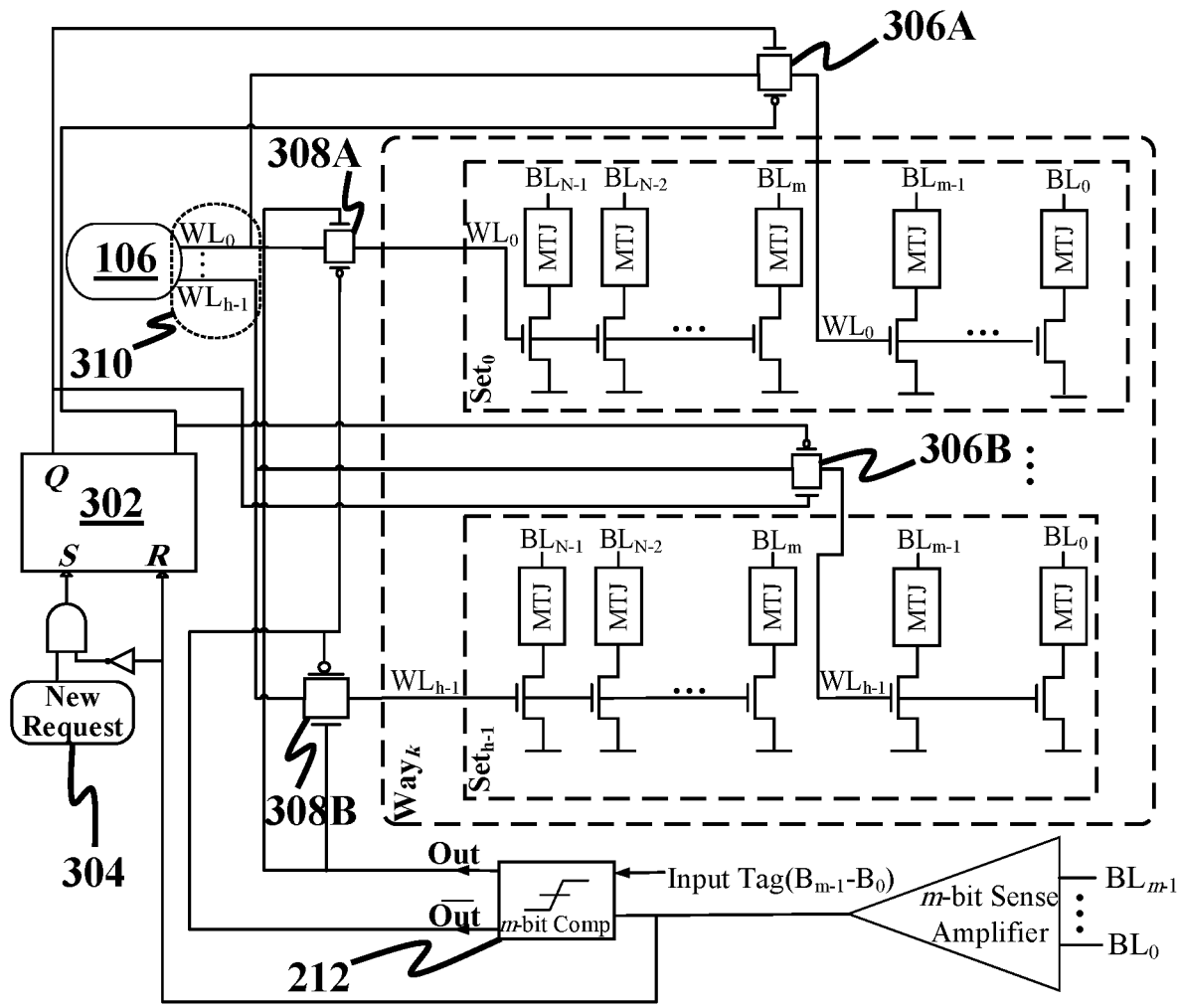
FIG. 3 shows a schematic of an internal structure of a tag way, consistent with one or more exemplary embodiments of the present disclosure.

In further detail with respect to a two-step partial access to each set of $k^{th}$ plurality of sets 204 in $k^{th}$ tag way 202, FIG. 3 shows a schematic of an internal structure of a tag way, consistent with one or more exemplary embodiments of the present disclosure. An exemplary circuit may further include a plurality of latch circuits. In an exemplary embodiment, $k^{th}$ tag way 202 may include a $k^{th}$ latch circuit 302 of the plurality of latch circuits. In an exemplary embodiment, $k^{th}$ latch circuit 302 may be configured to enable access of decoder 106 to $(i, k)^{th}$ plurality of LSBs 208 responsive to receiving a request signal 304. In an exemplary embodiment, request signal 304 may be associated with a read operation on cache memory 100. As a result, in an exemplary embodiment, when data is to be read from cache memory 100, request signal 304 may be sent to $k^{th}$ latch circuit 302 to initiate a read operation. Consequently, in an exemplary embodiment, $k^{th}$ latch circuit 302 may enable access of decoder 106 to $(i, k)^{th}$ plurality of LSBs 208. In an exemplary embodiment, $k^{th}$ latch circuit 302 may further be configured to disable access of decoder 106 to $(i, k)^{th}$ plurality of LSBs 208 responsive to decoder 106 accessing $(i, k)^{th}$ plurality of LSBs 208. Therefore, in an exemplary embodiment, once decoder 106 accesses $(i, k)^{th}$ plurality of LSBs 208, further access of decoder 106 to $(i, k)^{th}$ plurality of LSBs 208 may be disabled by $k^{th}$ latch circuit 302. As a result, in an exemplary embodiment, access of decoder 106 to $(i, k)^{th}$ plurality of LSBs 208 may be limited to one access for each read operation (i.e., receiving a new request signal by $k^{th}$ latch circuit 302).

An exemplary circuit may further include a plurality of LSB transition gates (for example, LSB transition gates 306A and 306B in FIG. 3). Each exemplary LSB transition gate of the plurality of LSB transition gates may be configured to enable access of decoder 106 to a respective plurality of LSBs responsive to a respective LSB transition gate being activated by $k^{th}$ latch circuit 302. As a result, in an exemplary embodiment, decoder 106 may access a respective plurality of LSBs if a respective LSB transition gate is activated by $k^{th}$ latch circuit 302.

An exemplary circuit may further include a plurality of MSB transition gates (for example, LSB transition gates 308A and 308B in FIG. 3). Each exemplary MSB transition gate of the plurality of MSB transition gates may be configured to enable access of decoder 106 to a respective plurality of MSBs responsive to a respective MSB transition gate being activated by $k^{th}$ m-bit comparator 212. As a result, in an exemplary embodiment, decoder 106 may access a respective plurality of MSBs if a respective MSB transition gate is activated by $k^{th}$ m-bit comparator 212.

Figure 4:
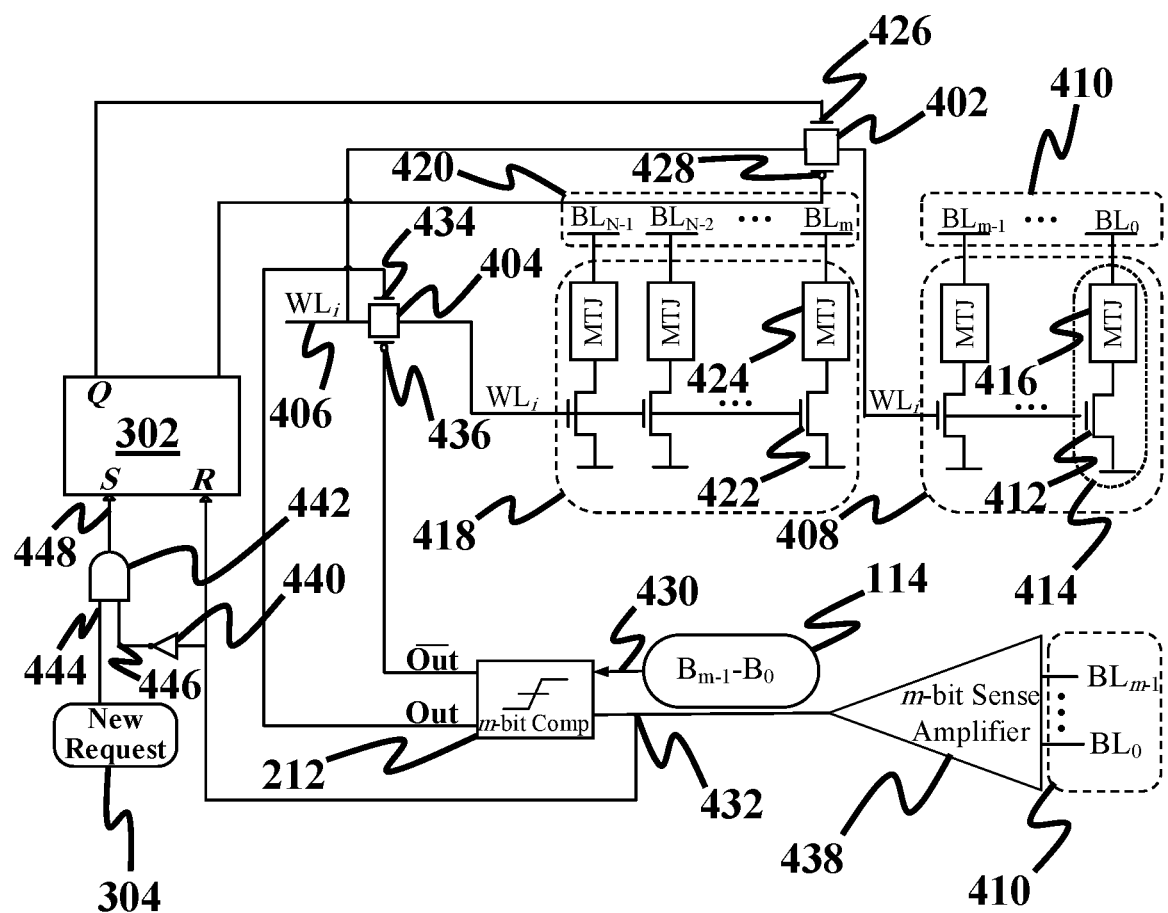
FIG. 4 shows a schematic of an electronic circuit, consistent with one or more exemplary embodiments of the present disclosure.

For further detail regarding the plurality of LSB transition gates and the plurality of MSB transition gates, FIG. 4 shows a schematic of an electronic circuit, consistent with one or more exemplary embodiments of the present disclosure. An exemplary circuit 400 may include hardware implementation of $(i, k)^{th}$ set 206 in $k^{th}$ tag way 202. Referring to FIGS. 2-4, an exemplary $(i, k)^{th}$ LSB transition gate 402 of the plurality of LSB transition gates may be configured to enable access of decoder 106 to $(i, k)^{th}$ plurality of LSBs 208 responsive to $(i, k)^{th}$ LSB transition gate 402 being activated by $k^{th}$ latch circuit 302. Therefore, in an exemplary embodiment, when $k^{th}$ latch circuit 302 activates $(i, k)^{th}$ LSB transition gate 402, decoder 106 may access $(i, k)^{th}$ plurality of LSBs 208.

An exemplary $(i, k)^{th}$ MSB transition gate 404 of the plurality of MSB transition gates may be configured to enable access of decoder 106 to $(i, k)^{th}$ plurality of MSBs 210 responsive to $(i, k)^{th}$ MSB transition gate 404 being activated by $k^{th}$ m-bit comparator 212. Therefore, in an exemplary embodiment, when $k^{th}$ m-bit comparator 212 activates $(i, k)^{th}$ MSB transition gate 404, decoder 106 may access $(i, k)^{th}$ plurality of MSBs 210.

In an exemplary embodiment, decoder 106 may include a plurality of decoder outputs 310. An exemplary $i^{th}$ decoder output 406 of plurality of decoder outputs 310 may be connected to each of $(i, k)^{th}$ LSB transition gate 402 and $(i, k)^{th}$ MSB transition gate 404. In an exemplary embodiment, $i^{th}$ decoder output 406 may be configured to load data stored in each respective lower memory cell of an $(i, k)^{th}$ plurality of lower memory cells 408 in cache memory 100 to a respective lower bit line of a plurality of lower bit lines 410 in cache memory 100 by loading a word line signal $WL_i$ to a respective access transistor (for example, an access transistor 412) of each respective lower memory cell (for example, a memory cell 414) responsive to $(i, k)^{th}$ LSB transition gate 402 being activated by $k^{th}$ latch circuit 302. In an exemplary embodiment, each respective lower bit line of plurality of lower bit lines 410 may be associated with a respective LSB of a respective plurality of LSBs. An exemplary lower bit line may be connected to a respective memory cell that may be configured to store a respective LSB of a respective plurality of LSBs.

In an exemplary embodiment, when word line signal $WL_i$ is active, i.e., index 112 is decoded to a value corresponding to $(i, k)^{th}$ set 206 that may cause decoder 106 to generate an active signal (for example, a logic '1') on $i^{th}$ decoder output 406, word line signal $WL_i$ may activate access transistor 412 (for example, by loading a voltage to a gate of access transistor 412) if $(i, k)^{th}$ LSB transition gate 402 is activated to allow access to access transistor 412. In an exemplary embodiment, access transistor 412 may load data stored in a storage element 416 of memory cell 414 to a bit line $BL_0$ of plurality of lower bit lines 410 after being activated by word line signal $WL_i$. In an exemplary embodiment, the process of loading data from storage element 416 to bit line $BL_0$ may be referred to as a read operation. An exemplary content of storage element 416 may be loaded from storage element 416 to bit line $BL_0$ via a current flow from access transistor 412 to bit line $BL_0$ through storage element 416.

In an exemplary embodiment, $i^{th}$ decoder output 406 may be further configured to load data stored in each respective higher memory cell of an $(i, k)^{th}$ plurality of higher memory cells 418 in the cache memory to a respective higher bit line of a plurality of higher bit lines 420 in cache memory 100 by loading word line signal $WL_i$ to a respective access transistor of each respective higher memory cell responsive to $(i, k)^{th}$ MSB transition gate 404 being activated by $k^{th}$ m-bit comparator 212. In an exemplary embodiment, each respective higher bit line of plurality of higher bit lines 420 may be associated with a respective MSB of a respective plurality of MSBs. An exemplary higher bit line may be connected to a respective memory cell that may be configured to store a respective MSB of a respective plurality of MSBs.

In an exemplary embodiment, when word line signal $WL_i$ is active, word line signal $WL_i$ may activate an access transistor 422 (for example, by loading a voltage to a gate of access transistor 422) if $(i, k)^{th}$ MSB transition gate 404 is activated to allow access to access transistor 422. In an exemplary embodiment, access transistor 422 may load data stored in a storage element 424 to a bit line $BL_m$ of plurality of higher bit lines 420 after being activated by word line signal $WL_i$. Further detail with respect to loading data to plurality of higher bit lines 420 is similar to loading data to plurality of lower bit lines 410 discussed above.

Figure 5:
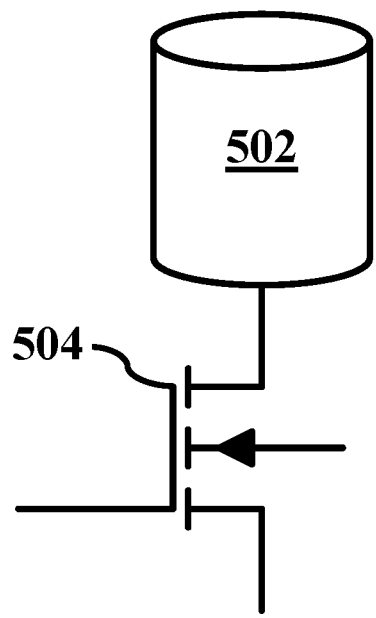
FIG. 5 shows a schematic of a spin-transfer torque magnetic random-access memory (STT-MRAM) cell, consistent with one or more exemplary embodiments of the present disclosure.

For further detail regarding $(i, k)^{th}$ plurality of lower memory cells 408 and $(i, k)^{th}$ plurality of higher memory cells 418, FIG. 5 shows a schematic of a spin-transfer torque magnetic random-access memory (STT-MRAM) cell, consistent with one or more exemplary embodiments of the present disclosure. An exemplary memory cell of each of $(i, k)^{th}$ plurality of lower memory cells 408 or $(i, k)^{th}$ plurality of higher memory cells 418 may include an STT-MRAM cell 500. In an exemplary embodiment, STT-MRAM cell 500 may include a storage element 502 (analogous to storage element 416 or storage element 424) and an access transistor 504 (analogous to access transistor 412 or access transistor 422). In an exemplary embodiment, access transistor 504 may be coupled to storage element 502. In an exemplary embodiment, accessing STT-MRAM cell 500 may include accessing storage element 502 via access transistor 504. In an exemplary embodiment, access transistor 504 may include an NMOS transistor used to connect and disconnect STT-MRAM cell 500 to a respective data line. In an exemplary embodiment, storage element 502 may include a magnetic tunnel junction (MTJ) that may utilize magnetic charge to store data. An exemplary MTJ may include three layers including two ferromagnetic layers and a thin oxide barrier layer which may separate the two ferromagnetic layers. To read a data from STT-MRAM cell 500, an exemplary current may flow through STT-MRAM cell 500 to measure the MTJ resistance. An exemplary read operation may be a unidirectional operation and may be in a same direction as writing either '1' or '0' in STT-MRAM cell 500. Therefore, during a read operation, the content of STT-MRAM cell may be probable to unintentionally switch from '1' to '0'. Therefore, in an exemplary embodiment, reducing number of accesses to STT-MRAM cell 500 may reduce the probability of data flip in STT-MRAM cell 500.

Referring again to FIGS. 2-4, in an exemplary embodiment, $k^{th}$ latch circuit 302 may include a set input S and a latch output Q. In an exemplary embodiment, set input S may be configured to activate $k^{th}$ latch circuit 302 responsive to receiving request signal 304 at set input S. As a result, in an exemplary embodiment, when request signal 304 is loaded to set input S, $k^{th}$ latch circuit 302 may be turned on and may activate latch output Q (for example, load a logic '1' to latch output Q). In an exemplary embodiment, latch output Q may be connected to a control input 426 of $(i, k)^{th}$ LSB transition gate 402. In an exemplary embodiment, latch output Q may be configured to enable the access of decoder 106 to each of $(i, k)^{th}$ plurality of LSBs 208 by activating $(i, k)^{th}$ LSB transition gate 402 via control input 426 responsive to $k^{th}$ latch circuit 302 being activated. In other words, in an exemplary embodiment, when latch output Q is activated by turning on $k^{th}$ latch circuit 302, latch output Q may turn on $(i, k)^{th}$ LSB transition gate 402 by activating control input 426 (for example, by loading a logic '1' to control input 426). Consequently, in an exemplary embodiment, decoder 106 may gain access to $(i, k)^{th}$ plurality of LSBs 208 through $(i, k)^{th}$ LSB transition gate 402.

In an exemplary embodiment, $k^{th}$ latch circuit 302 may further include a reset input R and an inverted latch output $\overline{Q}$. In an exemplary embodiment, reset input R may be coupled to each of plurality of lower bit lines 410. In an exemplary embodiment, reset input R may be configured to deactivate $k^{th}$ latch circuit 302 responsive to receiving data loaded from one or more of plurality of lower memory cells 408 on one or more of plurality of lower bit lines 410 at reset input R. As a result, in an exemplary embodiment, each time data stored in any lower memory cell of plurality of lower memory cells 408 is loaded to a corresponding bit line (i.e., data of a lower memory cell is read), reset input R may be activated and consequently, $k^{th}$ latch circuit 302 may be turned off and may activate inverted latch output $\overline{Q}$. Since, in an exemplary embodiment, inverted latch output $\overline{Q}$ may have an inverted value of latch output Q, activating inverted latch output $\overline{Q}$ may result in deactivating latch output Q. In an exemplary embodiment, inverted latch output $\overline{Q}$ may be connected to an inverted control input 428 of $(i, k)^{th}$ LSB transition gate 402. Since, in an exemplary embodiment, inverted control input 428 may have an inverted value of control input 426, activating inverted control input 428 may result in deactivating control input 426. In an exemplary embodiment, inverted latch output $\overline{Q}$ may be configured to disable the access of decoder 106 to $(i, k)^{th}$ plurality of LSBs 208 by deactivating $(i, k)^{th}$ LSB transition gate 402 via inverted control input 428 responsive to $k^{th}$ latch circuit 302 being deactivated by reset input R. In other words, in an exemplary embodiment, when inverted latch output $\overline{Q}$ is activated by turning off $k^{th}$ latch circuit 302, inverted latch output $\overline{Q}$ may turn off $(i, k)^{th}$ LSB transition gate 402 by activating inverted control input 428 (an consequently deactivating control input 426), for example, by loading a logic '1' to inverted control input 428. As a result, in an exemplary embodiment, decoder 106 may lose its access to $(i, k)^{th}$ plurality of LSBs 208.

In further detail with respect to $k^{th}$ m-bit comparator 212, in an exemplary embodiment, $k^{th}$ m-bit comparator 212 may include a first plurality of comparator inputs 430, a second plurality of comparator inputs 432, a comparator output Out, and an inverted comparator output $\overline{Out}$. In an exemplary embodiment, first plurality of comparator inputs 430 may be connected to m lower bits 114 of tag 116. In an exemplary embodiment, second plurality of comparator inputs 432 may be coupled to plurality of lower bit lines 410.

In an exemplary embodiment, comparator output Out may be connected to a control input 434 of $(i, k)^{th}$ MSB transition gate 404. In an exemplary embodiment, comparator output Out may be configured to enable access of decoder 106 to each of $(i, k)^{th}$ plurality of MSBs 210 by activating $(i, k)^{th}$ MSB transition gate 404 via control input 434 responsive to each respective first comparator input of first plurality of comparator inputs 430 being equal to a respective second comparator input of second plurality of comparator inputs 432. Therefore, in an exemplary embodiment, if each lower bit of m lower bits 114 of tag 116 (that are loaded to first plurality of comparator inputs 430) is equal to a corresponding LSB of $(i, k)^{th}$ plurality of LSBs 208 (that are loaded to plurality of lower bit lines 410), comparator output Out may be activated (for example, by being set to a logic '1'), and may consequently turn on $(i, k)^{th}$ MSB transition gate 404 by activating control input 434. As a result, decoder 106 may gain access to $(i, k)^{th}$ plurality of MSBs 210 through $(i, k)^{th}$ MSB transition gate 404. Accordingly, in an exemplary embodiment, decoder 106 may partially gain access to $(i, k)^{th}$ set 206 in two steps. In an exemplary first step, decoder 106 may gain access to the LSB part (i.e., $(i, k)^{th}$ plurality of LSBs 208) of $(i, k)^{th}$ set 206 through $(i, k)^{th}$ LSB transition gate 402. In an exemplary second step, decoder 106 may lose access to the LSB part and may gain access to the MSB part (i.e., $(i, k)^{th}$ plurality of MSBs 210) of $(i, k)^{th}$ set 206 through $(i, k)^{th}$ MSB transition gate 404 only if the LSB part is equal to a respective LSB part of tag 116 (i.e., m lower bits 114). As a result, unnecessary access to memory cells may be reduced and only memory cells may be accessed that are likely a part of a target block according to tag 116.

In an exemplary embodiment, inverted comparator output $\overline{Out}$ may be connected to an inverted control input 436 of $(i, k)^{th}$ MSB transition gate 404. In an exemplary embodiment, inverted comparator output $\overline{Out}$ may be configured to disable access of decoder 106 to $(i, k)^{th}$ plurality of MSBs 210 by deactivating $(i, k)^{th}$ MSB transition gate 404 via inverted control input 436 responsive to at least one respective first comparator input of first plurality of comparator inputs 430 being different from a respective second comparator input of second plurality of comparator inputs 432. As a result, in an exemplary embodiment, if any lower bit of m lower bits 114 of tag 116 (that are loaded to first plurality of comparator inputs 430) is different from a corresponding LSB of $(i, k)^{th}$ plurality of LSBs 208 (that are loaded to plurality of lower bit lines 410), inverted comparator output $\overline{Out}$ may be activated (for example, by being set to a logic '1'). Since, in an exemplary embodiment, inverted comparator output $\overline{Out}$ may have an inverted value of comparator output Out, activating inverted comparator output $\overline{Out}$ may lead to deactivation of comparator output Out. Consequently, $(i, k)^{th}$ MSB transition gate 404 may be turned off by activating inverted control input 436. As a result, decoder 106 may lose access to $(i, k)^{th}$ plurality of MSBs 210. Therefore, in an exemplary embodiment, decoder 106 may gain access to the MSB part of $(i, k)^{th}$ set 206 (i.e., $(i, k)^{th}$ plurality of MSBs 210) through $(i, k)^{th}$ MSB transition gate 404 only if the LSB part (i.e., $(i, k)^{th}$ plurality of LSBs 208) is equal to a respective LSB part of tag 116 (i.e., m lower bits 114). Further detail regarding $(i, k)^{th}$ MSB transition gate 404 may be similar to that of $(i, k)^{th}$ LSB transition gate 402 discussed above.

In an exemplary embodiment, circuit 400 may further include an m-bit sense amplifier 438. In an exemplary embodiment, m-bit sense amplifier 438 may be coupled to plurality of lower bit lines 410 and may receive plurality of lower bit lines 410 as inputs. In an exemplary embodiment, m-bit sense amplifier 438 may be configured to amplify signals on each of plurality of lower bit lines 438 to reach a recognizable logic level, because, in an exemplary embodiment, bit line data may be a low power signal with a low amplitude. As a result, in an exemplary embodiment, amplified signals of plurality of lower bit lines 410 may be loaded to second plurality of comparator inputs 432 so that data on each bit line may be interpreted properly by $k^{th}$ m-bit comparator 212.

An exemplary circuit may further include an inverter 440 and an AND gate 442. In an exemplary embodiment, inverter 440 may be coupled to plurality of lower bit lines 410. In an exemplary embodiment, AND gate 442 may include a first AND input 444, a second AND input 446, and an AND output 448. In an exemplary embodiment, first AND input 444 may be configured to receive request signal 304. In an exemplary embodiment, second AND input 446 may be connected to inverter 440. In an exemplary embodiment, second AND input 446 may be configured to be deactivated by inverter 440 responsive to receiving data from at least one of plurality of lower bit lines 410 by inverter 440. Therefore, in an exemplary embodiment, when data is loaded on plurality of lower bit lines 410 (i.e., a read operation is performed), inverter 440 may receive an active signal (for example, a logic '1') from plurality of lower bit lines 410 and consequently, may deactivate (for example, by setting to a logic '0') second AND input 446.

In an exemplary embodiment, AND output 448 may be connected to set input S. In an exemplary embodiment, AND output 448 may be configured to activate $k^{th}$ latch circuit 302 by activating set input S responsive to receiving request signal 304 by first AND input 444. As a result, in an exemplary embodiment, when a new request signal is generated, first AND input 444 may be activated (i.e., may be set to a logic '1'). Since, in an exemplary embodiment, plurality of lower bit lines 410 may be inactive prior to receiving a new read operation request via request signal 304, second AND input 446 may be active (i.e., a logic '1' may be loaded to second AND input 446 by inverter 440) prior to initiating a new read operation. Therefore, in an exemplary embodiment, AND gate 442 may perform a logic AND operation on two active inputs upon receiving a new read request, resulting in an active signal on AND output 448 that may activate set input S and consequently, $k^{th}$ latch circuit 302.

In an exemplary embodiment, AND output 448 may be further configured to deactivate set input S responsive to deactivating second AND input 446 by inverter 440. Therefore, in an exemplary embodiment, when data is loaded on plurality of lower bit lines 410 (i.e., a read operation is performed), inverter 440 may receive an active signal (for example, a logic '1') from plurality of lower bit lines 410 and consequently, may deactivate (for example, by setting to a logic '0') second AND input 446. As a result, in an exemplary embodiment, set input S may be deactivated by AND gate 442 and may remain deactivated until receiving a new read request via request signal 304.

Example 1

In this example, performance of an exemplary circuit for reducing read disturbance error in an 8-tag way set-associative SST-MRAM cache is evaluated. An exemplary circuit was stimulated and was compared with conventional tag comparison in STT-MRAM caches. Considering a 23-bit tag width in an 8-way associative L2 cache split into a lower 3-bit part and a higher 20-bit part, the evaluations showed that about 82.5% of tag ways were disabled for an exemplary circuit in each access on average. By eliminating unnecessary reads from tag cells, the read disturbance rate was reduced in the tag array of an exemplary circuit by an average of about 71.7%. As a by-product, the reduced number of read operations and comparisons resulted in 63.6% energy saving in the tag array. These significant improvements were achieved without increasing the cache access time.

Figure 6:
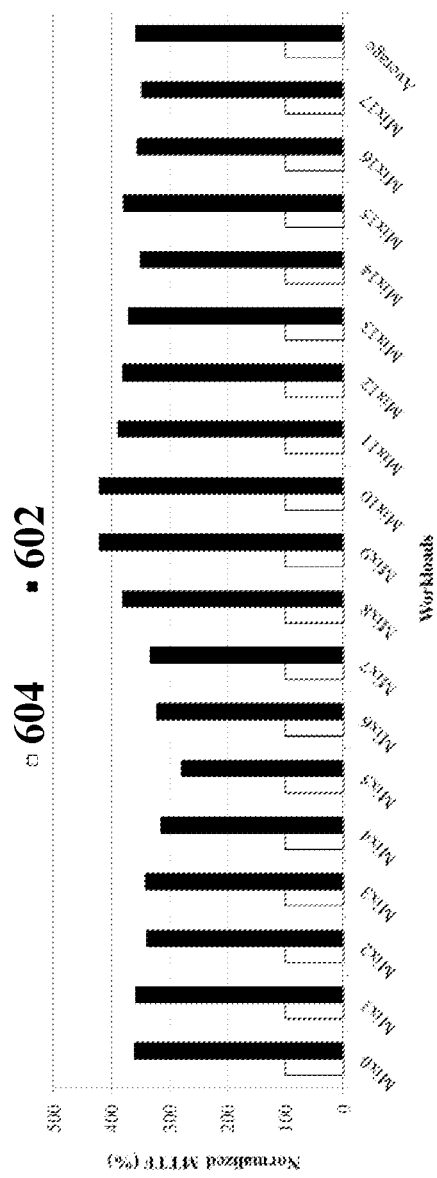
FIG. 6 shows a mean time to failure (MTTF) of a tag array normalized to a baseline for different workloads, consistent with one or more exemplary embodiments of the present disclosure.

FIG. 6 shows a mean time to failure (MTTF) in a tag array 602 normalized to a baseline 604 for different workloads, consistent with one or more exemplary embodiments of the present disclosure. The average of MTTF in an exemplary tag array is about 357.9%. MTTF in an exemplary tag array is even higher than about 420% in Mix9 and Mix10 workloads and is slightly less than about 300% in only Mix5 workload. Therefore, an exemplary tag array extends MTTF to about 3.6×.

Example 2

Figure 7A:
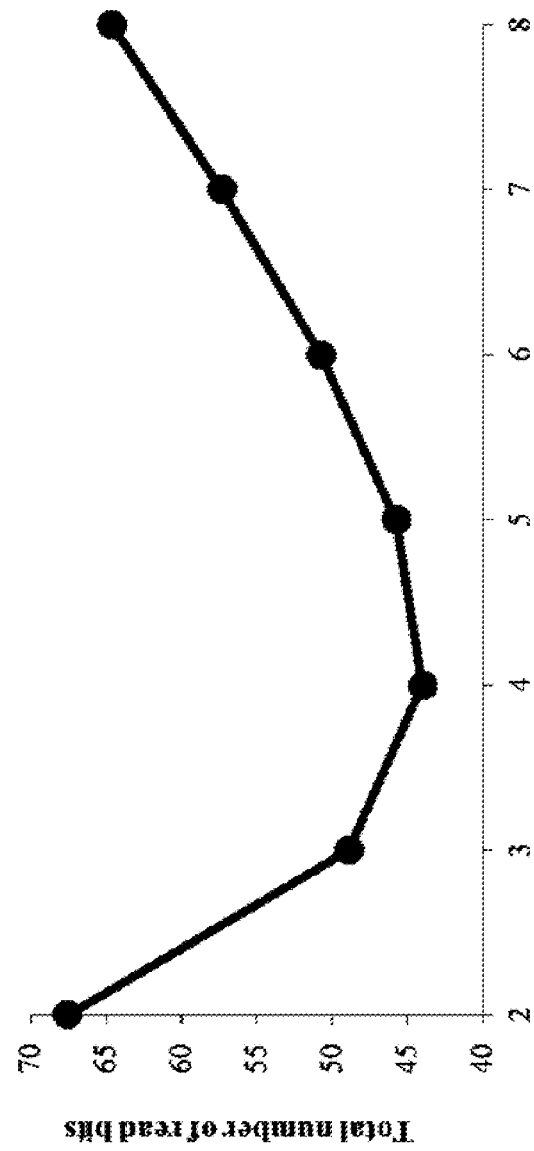
FIG. 7A shows total number of read bits for an 8-tag way set associative cache memory, consistent with one or more exemplary embodiments of the present disclosure.
Figure 7B:
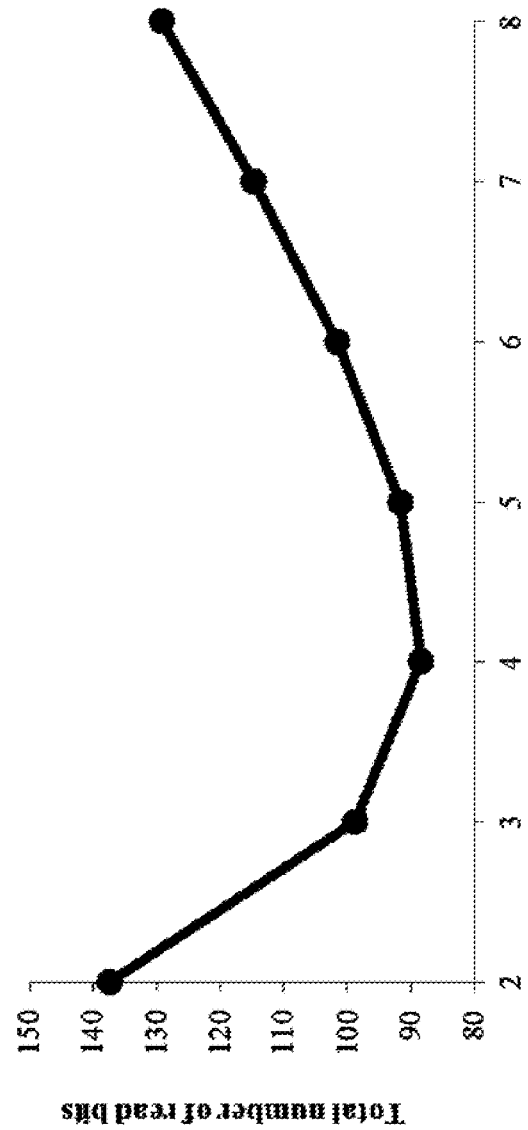
FIG. 7B shows total number of read bits for a 16-tag way set associative cache memory, consistent with one or more exemplary embodiments of the present disclosure.
Figure 7C:
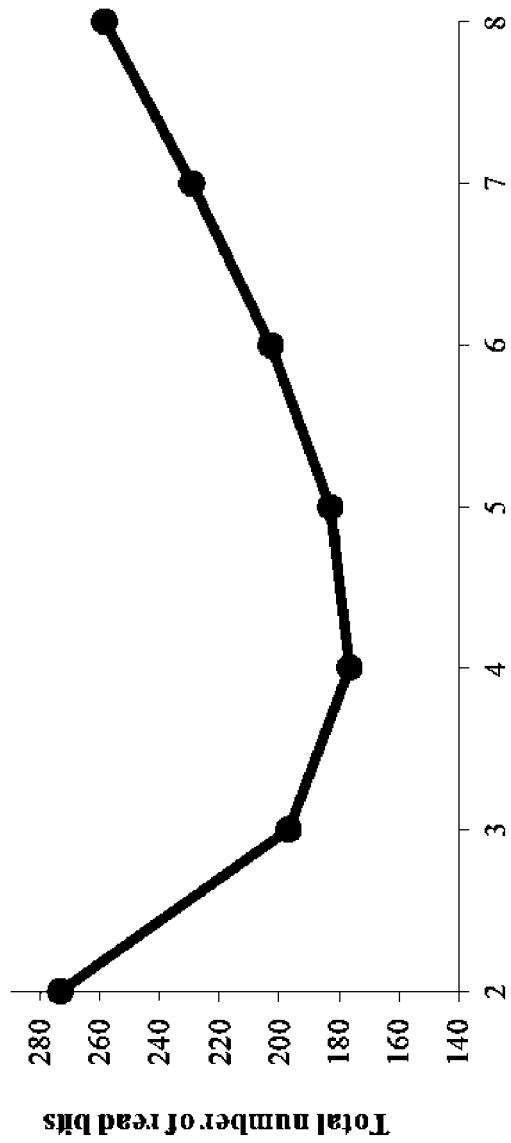
FIG. 7C shows total number of read bits for a 32-tag way set associative cache memory, consistent with one or more exemplary embodiments of the present disclosure.

In this example, variations of total number of read bits with different sizes of a lower parts of an exemplary tag way is demonstrated. Exemplary cache memories with 8, 16, and 3 tag way set associative caches were stimulated. FIG. 7A shows total number of read bits for an 8-tag way set associative cache memory, consistent with one or more exemplary embodiments of the present disclosure. FIG. 7B shows total number of read bits for a 16-tag way set associative cache memory, consistent with one or more exemplary embodiments of the present disclosure. FIG. 7C shows total number of read bits for a 32-tag way set associative cache memory, consistent with one or more exemplary embodiments of the present disclosure. Referring to FIGS. 7A-7C, the total number of read bits is increased by increasing the associativity of the cache. In 8-way associativity, reading four bits in the first step (i.e., comparing the lower part of a tag way) results in the minimum number of total read bits. The minimum number of total read bits for 16- and 32-way set associative caches with the same address bus length is remained four. This optimal number of reads is the same for all the caches with different ways, as long as the address length is the same.

Figure 8:
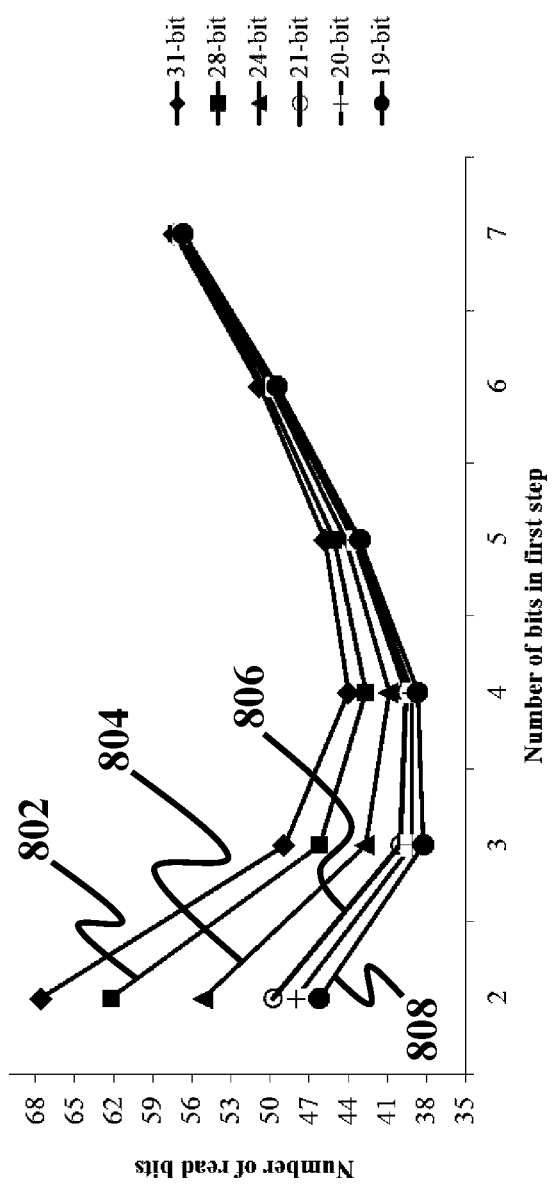
FIG. 8 shows total number of read bits for different cache sizes, consistent with one or more exemplary embodiments of the present disclosure.

FIG. 8 shows total number of read bits for different cache sizes, consistent with one or more exemplary embodiments of the present disclosure. Referring to FIG. 8, the optimal number of tag bits in the first step for obtaining a minimum total number of read bits is equal to four for a 28-bit tag length (8 MB cache) 802, a 24-bit tag length (128 MB cache) 804, and a 21-bit tag length (1 GB cache) 806. However, a minimum total number of read bits for a 19-bit tag length 808 is achieved when the optimal number of tag bits in the first step is equal to three. As a result, the optimum value is reduced from four to three when the cache size increases by $2^{12}$ times compared to a conventional size. Consequently, the increase in cache associativity does not change the optimal number of read bits in the first step, whereas a reasonable increase or decrease in the cache size can affect this number. The increase in cache size can decrease the optimal number of bits in the first step, if the cache size is increased by at least $2^{12}$ times.

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a tag way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A circuit for reducing read disturbance error in a cache memory comprising a tag array, the tag array comprising a plurality of tag ways, a $k^{th}$ tag way of the plurality of tag ways, where $0 \leq k \leq K-1$ and K is a number of the plurality of tag ways, comprising a $k^{th}$ plurality of sets, each respective set of the $k^{th}$ plurality of sets comprising a respective plurality of Least Significant Bits (LSBs) and a respective plurality of Most Significant Bits (MSBs), the circuit comprising:

a decoder coupled to the plurality of tag ways, the decoder configured to enable access to an $(i, k)^{th}$ set of the $k^{th}$ plurality of sets based on a value of an index of a requested address in the cache memory, where $0 \leq i \leq h-1$ and h is a number of the $k^{th}$ plurality of sets;

a plurality of m-bit comparators where m is a number of an $(i, k)^{th}$ plurality of LSBs of the $(i, k)^{th}$ set, a $k^{th}$ m-bit comparator of the plurality of m-bit comparators configured to:

access the $(i, k)^{th}$ plurality of LSBs responsive to the access to the $(i, k)^{th}$ set being enabled by the decoder;

compare the $(i, k)^{th}$ plurality of LSBs with m lower bits of a tag of the requested address; and enable access to an $(i, k)^{th}$ plurality of MSBs of the $(i, k)^{th}$ set responsive to each respective LSB of the $(i, k)^{th}$ plurality of LSBs being equal to a respective lower bit of the tag; and a plurality of n-bit comparators where n is a number of the $(i, k)^{th}$ plurality of MSBs, a $k^{th}$ n-bit comparator of the plurality of n-bit comparators configured to:

access the $(i, k)^{th}$ plurality of MSBs responsive to the access to the $(i, k)^{th}$ plurality of MSBs being enabled by the $k^{th}$ m-bit comparator;

compare the $(i, k)^{th}$ plurality of MSBs with n higher bits of the tag; and enable access to the $(i, k)^{th}$ set by a data bus responsive to each respective MSB of the $(i, k)^{th}$ plurality of MSBs being equal to a respective higher bit of the tag.

2. The circuit of claim 1, further comprising a plurality of latch circuits, a $k^{th}$ latch circuit of the plurality of latch circuits configured to:

enable access of the decoder to the $(i, k)^{th}$ plurality of LSBs responsive to receiving a request signal associated with a read operation from the cache memory; and disable access of the decoder to the $(i, k)^{th}$ plurality of LSBs responsive the decoder accessing the $(i, k)^{th}$ plurality of LSBs.

3. The circuit of claim 2, further comprising a plurality of LSB transition gates, an $(i, k)^{th}$ LSB transition gate of the plurality of LSB transition gates configured to enable access of the decoder to the $(i, k)^{th}$ plurality of LSBs responsive to the $(i, k)^{th}$ LSB transition gate being activated by the $k^{th}$ latch circuit.

4. The circuit of claim 3, further comprising a plurality of MSB transition gates, an $(i, k)^{th}$ MSB transition gate of the plurality of MSB transition gates configured to enable access of the decoder to the $(i, k)^{th}$ plurality of MSBs responsive to the $(i, k)^{th}$ MSB transition gate being activated by the $k^{th}$ m-bit comparator.

5. The circuit of claim 4, wherein the decoder comprises a plurality of decoder outputs, an $i^{th}$ decoder output of the plurality of decoder outputs connected to each of the $(i, k)^{th}$ LSB transition gate and the $(i, k)^{th}$ MSB transition gate, the $i^{th}$ decoder output configured to:

load data stored in each respective lower memory cell of an $(i, k)^{th}$ plurality of lower memory cells in the cache memory to a respective lower bit line of a plurality of lower bit lines in the cache memory by loading a word line signal to a respective access transistor of each respective lower memory cell responsive to the $(i, k)^{th}$ LSB transition gate being activated by the $k^{th}$ latch circuit, each respective lower bit line of the plurality of lower bit lines associated with a respective LSB of a respective plurality of LSBs; and load data stored in each respective higher memory cell of an $(i, k)^{th}$ plurality of higher memory cells in the cache memory to a respective higher bit line of a plurality of higher bit lines in the cache memory by loading the word line signal to a respective access transistor of each respective higher memory cell responsive to the $(i, k)^{th}$ MSB transition gate being activated by the $k^{th}$ m-bit comparator, each respective higher bit line of the plurality of higher bit lines associated with a respective MSB of a respective plurality of MSBs.

6. The circuit of claim 5, wherein the $k^{th}$ latch circuit comprises:

a set input configured to activate the $k^{th}$ latch circuit responsive to receiving the request signal at the set input; and a latch output connected to a control input of the $(i, k)^{th}$ LSB transition gate, the latch output configured to enable the access of the decoder to each of the $(i, k)^{th}$ plurality of LSBs by activating the $(i, k)^{th}$ LSB transition gate via the control input responsive to the $k^{th}$ latch circuit being activated.

7. The circuit of claim 6, wherein the $k^{th}$ latch circuit further comprises:

a reset input coupled to each of the plurality of lower bit lines, the reset input configured to deactivate the $k^{th}$ latch circuit responsive to receiving data loaded from one or more of the plurality of lower memory cells on one or more of the plurality of lower bit lines at the reset input; and an inverted latch output connected to an inverted control input of the $(i, k)^{th}$ LSB transition gate, the inverted latch output configured to disable the access of the decoder to the $(i, k)^{th}$ plurality of LSBs by deactivating the $(i, k)^{th}$ LSB transition gate via the inverted control input responsive to the $k^{th}$ latch circuit being deactivated by the reset input.

8. The circuit of claim 5, wherein the $k^{th}$ m-bit comparator comprises:

a first plurality of comparator inputs connected to the m lower bits of the tag;

a second plurality of comparator inputs coupled to the plurality of lower bit lines;

a comparator output connected to a control input of the $(i, k)^{th}$ MSB transition gate, the comparator output configured to enable the access of the decoder to each of the $(i, k)^{th}$ plurality of MSBs by activating the $(i, k)^{th}$ MSB transition gate via the control input responsive to each respective first comparator input of the first plurality of comparator inputs being equal to a respective second comparator input of the second plurality of comparator inputs; and an inverted comparator output connected to an inverted control input of the (i, k)$^{th}$ MSB transition gate, the inverted comparator output configured to disable the access of the decoder to the (i, k)$^{th}$ plurality of MSBs by deactivating the (i, k)$^{th}$ MSB transition gate via the inverted control input responsive to at least one respective first comparator input of the first plurality of comparator inputs being different from a respective second comparator input of the second plurality of comparator inputs.

9. The circuit of claim 8, further comprising an m-bit sense amplifier coupled to the plurality of lower bit lines, the m-bit sense amplifier configured to amplify signals on each of the plurality of lower bit lines.

10. The circuit of claim 9, further comprising:
an inverter coupled to the plurality of lower bit lines; and
an AND gate comprising:
  a first AND input configured to receive the request signal;
  a second AND input connected to the inverter, the second AND input configured to be deactivated by the inverter responsive to receiving data from at least one of the plurality of lower bit lines by the inverter; and
  an AND output connected to the set input, the AND output configured to:
    activate the k$^{th}$ latch circuit by activating the set input responsive to receiving the request signal by the first AND input; and
    deactivate the set input responsive to deactivating the second AND input by the inverter.

11. The circuit of claim 1, further comprising a plurality of buffer circuits, a k$^{th}$ buffer circuit of the plurality of buffer circuits configured to load data stored in the (i, k)$^{th}$ set on the data bus responsive to each respective MSB of the (i, k)$^{th}$ plurality of MSBs being equal to a respective higher bit of the tag.

12. The circuit of claim 11, wherein the k$^{th}$ buffer circuit comprises a buffer control input coupled to the k$^{th}$n-bit comparator, the buffer control input configured to activate the k$^{th}$ buffer circuit responsive to being activated by the k$^{th}$n-bit comparator.

13. The circuit of claim 1, wherein the number of the (i, k)$^{th}$ plurality of LSBs is determined according to an operation defined by the following:

$$m = \frac{1 + N \times \ln 2 - Productlog[2^N e]}{\ln 2}$$

where:
N is a sum of the number of the (i, k)$^{th}$ plurality of LSBs and the number of the (i, k)$^{th}$ plurality of MSBs,
e is the Euler's number, and
Productlog [·] is a Lambert W function.

14. A tag array of a cache memory, the tag array comprising:
a plurality of bit lines comprising a plurality of lower bit lines and a plurality of higher bit lines;
a plurality of tag ways, a k$^{th}$ tag way of the plurality of tag ways where 0≤k≤K−1 and K is a number of the plurality of tag ways comprising a k$^{th}$ plurality of sets, each respective set of the k$^{th}$ plurality of sets comprising a respective plurality of memory cells, comprising:
  a respective plurality of lower memory cells, each respective lower memory cell of the respective plurality of lower memory cells comprising:
    a respective lower storage element coupled to a respective lower bit line of the plurality of lower bit lines and configured to store a respective Least Significant Bit (LSB) of a respective plurality of LSBs; and
    a respective lower access transistor connected to the respective lower storage element and configured to load data stored in the respective lower storage element to the respective lower bit line responsive to the respective lower access transistor being activated;
  a respective plurality of higher memory cells, each respective higher memory cell of a respective plurality of higher memory cells comprising:
    a respective higher storage element coupled to a respective higher bit line of the plurality of higher bit lines and configured to store a respective Most Significant Bit (MSB) of a respective plurality of MSBs; and
    a respective higher access transistor connected to the respective higher storage element and configured to load data stored in the respective higher storage element to the respective higher bit line responsive to the respective higher access transistor being activated;
a decoder coupled to the plurality of tag ways, the decoder configured to enable access to an (i, k)$^{th}$ set of the k$^{th}$ plurality of sets based on a value of an index of a requested address in the cache memory, where 0≤i≤h−1 and h is a number of the k$^{th}$ plurality of sets;
a plurality of m-bit comparators where m is a number of an (i, k)$^{th}$ plurality of LSBs of the (i, k)$^{th}$ set, a k$^{th}$ m-bit comparator of the plurality of m-bit comparators configured to:
  access the (i, k)$^{th}$ plurality of LSBs responsive to the access to the (i, k)$^{th}$ set being enabled by the decoder;
  compare the (i, k)$^{th}$ plurality of LSBs with m lower bits of a tag of the requested address; and
  enable access to an (i, k)$^{th}$ plurality of MSBs of the (i, k)$^{th}$ set responsive to each respective LSB of the (i, k)$^{th}$ plurality of LSBs being equal to a respective lower bit of the tag;
a plurality of n-bit comparators where n is a number of the (i, k)$^{th}$ plurality of MSBs, a k$^{th}$n-bit comparator of the plurality of n-bit comparators configured to:
  access the (i, k)$^{th}$ plurality of MSBs responsive to the access to the (i, k)$^{th}$ plurality of MSBs being enabled by the k$^{th}$ m-bit comparator;
  compare the (i, k)$^{th}$ plurality of MSBs with n higher bits of the tag; and
  enable access to the (i, k)$^{th}$ set responsive to each respective MSB of the (i, k)$^{th}$ plurality of MSBs being equal to a respective higher bit of the tag;
a data bus configured to access the (i, k)$^{th}$ set responsive to the access to the (i, k)$^{th}$ set being enabled by the k$^{th}$n-bit comparator;
a plurality of latch circuits, a k$^{th}$ latch circuit of the plurality of latch circuits configured to:
  enable access of the decoder to the (i, k)$^{th}$ plurality of LSBs responsive to receiving a request signal associated with a read operation from the cache memory; and disable access of the decoder to the (i, k)$^{th}$ plurality of LSBs responsive the decoder accessing the (i, k)$^{th}$ plurality of LSBs;

a plurality of LSB transition gates, an (i, k)$^{th}$ LSB transition gate of the plurality of LSB transition gates configured to enable access of the decoder to the (i, k)$^{th}$ plurality of LSBs responsive to the (i, k)$^{th}$ LSB transition gate being activated by the k$^{th}$ latch circuit;

a plurality of MSB transition gates, an (i, k)$^{th}$ MSB transition gate of the plurality of MSB transition gates configured to enable access of the decoder to the (i, k)$^{th}$ plurality of MSBs responsive to the (i, k)$^{th}$ MSB transition gate being activated by the k$^{th}$ m-bit comparator;

an m-bit sense amplifier coupled to the plurality of lower bit lines, the m-bit sense amplifier configured to amplify signals on each of the plurality of lower bit lines; and a plurality of buffer circuits, a k$^{th}$ buffer circuit of the plurality of buffer circuits configured to load data stored in the (i, k)$^{th}$ set on the data bus responsive to each respective MSB of the (i, k)$^{th}$ plurality of MSBs being equal to a respective higher bit of the tag, the k$^{th}$ buffer circuit comprising a buffer control input coupled to the k$^{th}$ n-bit comparator, buffer control input configured to activate the k$^{th}$ buffer circuit responsive to being activated by the k$^{th}$ n-bit comparator.

15. The tag array of claim 14, wherein the decoder comprises a plurality of decoder outputs, an i$^{th}$ decoder output of the plurality of decoder outputs connected to each of the (i, k)$^{th}$ LSB transition gate and the (i, k)$^{th}$ MSB transition gate, the i$^{th}$ decoder output configured to:

load data stored in each respective lower storage element to a respective lower bit line of the plurality of lower bit lines by loading a word line signal to a respective lower access transistor responsive to the (i, k)$^{th}$ LSB transition gate being activated by the k$^{th}$ latch circuit; and load data stored in each respective higher storage element to a respective higher bit line of the plurality of higher bit lines by loading the word line signal to a respective higher access transistor responsive to the (i, k)$^{th}$ MSB transition gate being activated by the k$^{th}$ m-bit comparator.

16. The tag array of claim 15, wherein the k$^{th}$ latch circuit comprises:

a set input configured to activate the k$^{th}$ latch circuit responsive to receiving the request signal at the set input; and a latch output connected to a control input of the (i, k)$^{th}$ LSB transition gate, the latch output configured to enable the access of the decoder to each of the (i, k)$^{th}$ plurality of LSBs by activating the (i, k)$^{th}$ LSB transition gate via the control input responsive to the k$^{th}$ latch circuit being activated;

a reset input coupled to each of the plurality of lower bit lines, the reset input configured to deactivate the k$^{th}$ latch circuit responsive to receiving data loaded on one or more of the plurality of lower bit lines at the reset input; and an inverted latch output connected to an inverted control input of the (i, k)$^{th}$ LSB transition gate, the inverted latch output configured to disable the access of the decoder to the (i, k)$^{th}$ plurality of LSBs by deactivating the (i, k)$^{th}$ LSB transition gate via the inverted control input responsive to the k$^{th}$ latch circuit being deactivated by the reset input.

17. The tag array of claim 16, wherein the k$^{th}$ m-bit comparator comprises:

a first plurality of comparator inputs connected to the m lower bits of the tag;

a second plurality of comparator inputs coupled to the plurality of lower bit lines;

a comparator output connected to a control input of the (i, k)$^{th}$ MSB transition gate, the comparator output configured to enable the access of the decoder to each of the (i, k)$^{th}$ plurality of MSBs by activating the (i, k)$^{th}$ MSB transition gate via the control input of the (i, k)$^{th}$ MSB transition gate responsive to each respective first comparator input of the first plurality of comparator inputs being equal to a respective second comparator input of the second plurality of comparator inputs; and an inverted comparator output connected to an inverted control input of the (i, k)$^{th}$ MSB transition gate, the inverted comparator output configured to disable the access of the decoder to the (i, k)$^{th}$ plurality of MSBs by deactivating the (i, k)$^{th}$ MSB transition gate via the inverted control input of the (i, k)$^{th}$ MSB transition gate responsive to at least one respective first comparator input of the first plurality of comparator inputs being different from a respective second comparator input of the second plurality of comparator inputs.

18. The tag array of claim 17, further comprising:

an inverter coupled to the plurality of lower bit lines; and an AND gate comprising:

a first AND input configured to receive the request signal;

a second AND input connected to the inverter, the second AND input configured to be deactivated by the inverter responsive to receiving data from at least one of the plurality of lower bit lines by the inverter; and an AND output connected to the set input, the AND output configured to:

activate the k$^{th}$ latch circuit by activating the set input responsive to receiving the request signal by the first AND input; and deactivate the set input responsive to deactivating the second AND input by the inverter.

19. The tag array of claim 18, wherein the number of the (i, k)$^{th}$ plurality of LSBs is determined according to an operation defined by the following:

$$m = \frac{1 + N \times \ln 2 - Productlog[2^N e]}{\ln 2}$$

where:

N is a sum of the number of the (i, k)$^{th}$ plurality of LSBs and the number of the (i, k)$^{th}$ plurality of MSBs, e is the Euler's number, and Productlog [·] is a Lambert W function.

20. The tag array of claim 19, wherein respective plurality of memory cells of the k$^{th}$ plurality of sets comprises a spin-transfer torque magnetic random-access memory (STT-MRAM) cell.

* * * * *